United States Patent
Lin et al.

(10) Patent No.: US 6,197,652 B1
(45) Date of Patent: Mar. 6, 2001

(54) FABRICATION METHOD OF A TWIN-TUB CAPACITOR

(75) Inventors: Dahcheng Lin; Chih-Hsing Yu, both of Hsinchu (TW)

(73) Assignee: Worldwide Semiconductor Manufacturing Corp., Hsinchu (TW)

( * ) Notice: Subject to any disclaimer, the term of this patent is extended or adjusted under 35 U.S.C. 154(b) by 0 days.

(21) Appl. No.: 09/326,390

(22) Filed: Jun. 4, 1999

(30) Foreign Application Priority Data

Apr. 15, 1999 (TW) .................................. 88106001

(51) Int. Cl.$^7$ ................................ H01L 21/8242
(52) U.S. Cl. .................... 438/397; 438/253; 438/254; 438/255; 438/396; 438/398
(58) Field of Search .................... 438/253, 254, 438/255, 396, 397, 398

(56) References Cited

U.S. PATENT DOCUMENTS

| | | | |
|---|---|---|---|
| 5,468,670 | * | 11/1995 | Ryou ..................................... 438/253 |
| 5,650,351 | * | 7/1997 | Wu ....................................... 438/398 |
| 5,652,165 | * | 7/1997 | Lu et al. ............................... 438/396 |
| 5,721,154 | * | 2/1998 | Jeng ..................................... 438/253 |
| 5,759,895 | * | 6/1998 | Tseng .................................... 438/255 |
| 5,789,290 | * | 8/1998 | Sun ...................................... 438/253 |

* cited by examiner

*Primary Examiner*—Carl Whitehead, Jr.
*Assistant Examiner*—Toniae M. Thomas
(74) *Attorney, Agent, or Firm*—Jiawei Huang; J C Patents

(57) ABSTRACT

A method of fabricating a twin-tub capacitor is described in which a dielectric layer is defined to form multiple column structures, followed by forming a conductive layer over the column structures. The conductive layer on the top surface of the column structures are removed by chemical mechanical polishing to isolate each capacitor. The column structures are further removed to form a twin-tub capacitor.

18 Claims, 4 Drawing Sheets

FABRICATION METHOD OF A TWIN-TUB CAPACITOR

CROSS-REFERENCE TO RELATED APPLICATION

This application claims the priority benefit of Taiwan application serial no. 88106001, filed Apr. 15, 1999, the full disclosure of which is incorporated herein by reference.

BACKGROUND OF THE INVENTION

1. Field of the Invention

The present invention relates to a fabrication method of a capacitor for a semiconductor memory cell, and more particularly, relates to fabrication method of a twin-tub capacitor for a DRAM (Dynamic Random Access Memory) cell.

2. Description of the Related Art

As the dimensions of semiconductor devices are being scaled down to a deep sub-micron level, the size of the capacitor in a DRAM cell is also being reduced. Since the capacitance is proportional to the surface area of the capacitor, as the area of a memory cell decreases, the capacitance of the capacitor tends to decrease, thereby lowering the performance of the memory cells. On the other hand, the advances in computer applications have increased the demand for high capacity memory chips. Thus, the demand of decreasing the size of the memory cells while simultaneously increasing the memory chip capacity has altered the direction of the advancements of the fabrication of a DRAM memory cell capacitor.

For a semiconductor memory cell capacitor, reducing the dielectric layer thickness, substituting with high dielectric constant materials and increasing the capacitor surface area are the three methods generally used to increase a cell capacitance. Among the three methods, reducing the dielectric layer thickness and increasing the dielectric constant pose technical challenges, especially in mass productions where the reliability of the device and the yield risks may be affected. Thus, increasing the surface area of a capacitor is the preferred approach to increase the capacitance in a limited cell size.

Currently, the surface area of a capacitor is increased by means of the hemispherical grain (HSG) technology or changing the capacitor surface. The HSG process is popular and widely used in the semiconductor field; however, the equipment for the process is more expensive compared to the traditional low pressure chemical vapor deposition (LPCVD) furnace. Furthermore, the HSG growth process is complicated and vulnerable to variations, compared to changing the capacitor structure, which is simple and easy to manipulate.

FIGS. 1A to 1C are cross-sectional views of the conventional stack, crown and twin-tub capacitors.

According to FIGS. 1A to 1C, the stack 100 and crown 102 capacitors are the two most frequently used structures for a DRAM cell application. Between these two capacitors, the crown capacitor 102 is preferred because of the extra surface area from its inner wall.

The more advanced twin-tub capacitor 104 comprises even more inner walls than that of the crown capacitor 102. Hence, the twin-tub capacitor 104 has the most surface areas among the three types of capacitor, and is the most appropriate type of capacitor to meet the current trend of having a high capacity memory with a reduced cell size.

Related activities in the manufacturing of a twin-tub capacitor can be referred to U.S. Pat. Nos. 5,652,165 and 5,721,154.

SUMMARY OF THE INVENTION

Accordingly, this invention provides a fabrication method for a twin-tub capacitor within increased surface area.

The current invention provides a fabrication method of a twin-tub capacitor comprises the following steps. A substrate is provided. A first dielectric layer is formed to cover the substrate, followed by a deposition of an etching stop layer on the first dielectric layer. A contact window is etched in the etching stop layer and the first dielectric layer. Consequently, a first conductive layer is deposited, covering the etching stop layer and filling in the contact window. The first conductive layer is defined, and then deposited over by a layer of a second dielectric layer. Thereafter, the second dielectric layer is defined to form a plurality of column structures. A second conformal conductive layer is deposited on the surface of the column structures, followed by a removal of the second conductive layer located on the top surface of the column structures. After which, the column structures are removed.

The current invention uses a dielectric layer to form a multiple column structures, followed by forming a conductive layer to cover the column structures. A chemical mechanical polish process is conducted to remove the conductive layer located on the top surface of the column structures in order to isolate each capacitor. These column structures are further removed to form a twin-tub capacitor.

This invention uses the current semiconductor fabrication techniques. The entire process is simple and easy to apply to the fabrication of a DRAM cell.

The current invention provides a twin-tub capacitor with an increased surface area, thereby increasing the capacitance of the device.

This invention further discloses that a simultaneous application of a hemispherical grain technique and a twin-tub structure enhances the development of a high capacitance capacitor, which is consistent with the current development trend of a semiconductor device.

BRIEF DESCRIPTION OF THE DRAWINGS

The accompanying drawings illustrate presently the preferred embodiments of the invention and together with the general description given above and the detailed description of the preferred embodiment given below, serve to explain the principles of the invention.

DESCRIPTION OF THE PREFERRED EMBODIMENTS

Figure 1A:
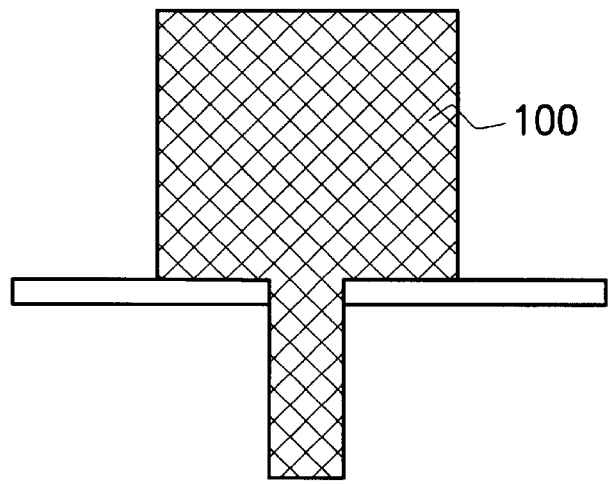
FIGS. 1A to 1C are cross sectional views of the conventional stack type, crown type and twin-tub capacitors, respectively.
Figure 1B:
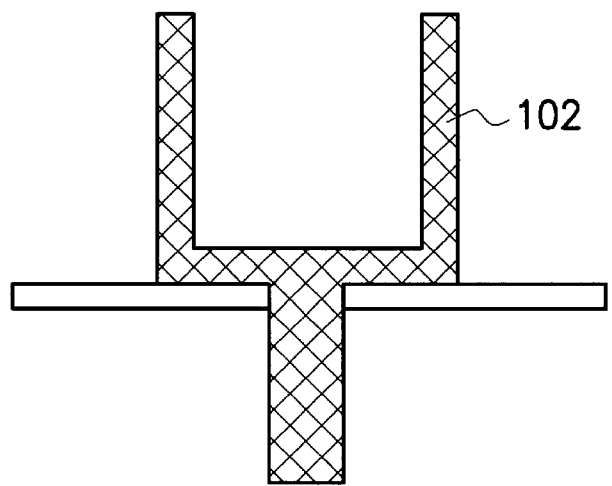
Figure 1C:
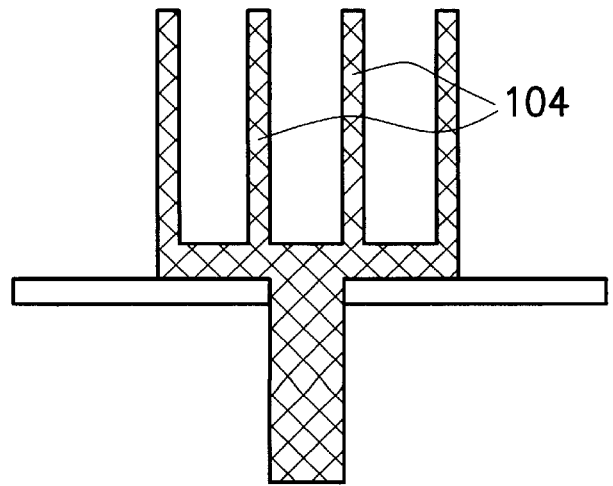

FIGS. 2A to 2G are cross sectional views of a twin-tub capacitor showing the manufacturing process of a twin-tub capacitor according to the present invention.

Referring to FIG. 2, a dielectric layer 202 is deposited over a substrate 200. The substrate 200 comprises components (not shown in Figure), and the dielectric layer 202 for example, an silicon oxide layer, is an inter-layer dielectric (ILD), deposited by methods such as a chemical vapor deposition method.

An etching stop layer 204 is then deposited over the dielectric layer 202. The etching stop layer 204, for example a layer of silicon nitride, is formed by methods including a chemical vapor deposition method. A photolithography and etching technique is used to define a contact window 206 in the dielectric layer 202 and the etching stop layer 204.

A conductive layer 208 is deposited over the etching stop layer 204, filling in the contact window 206 for the purpose of forming a bottom electrode for the capacitor. The conductive layer 208, for example a doped polysilicon layer, is deposited by methods including a low pressure chemical vapor deposition method.

Figure 2A:
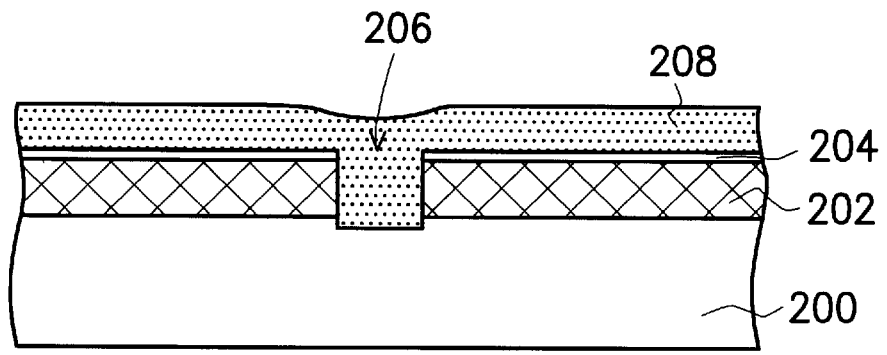
FIGS. 2A to 2G are cross sectional views of a twin-tub capacitor showing the manufacturing process of a twin-tub capacitor according to the present invention.
Figure 2B:
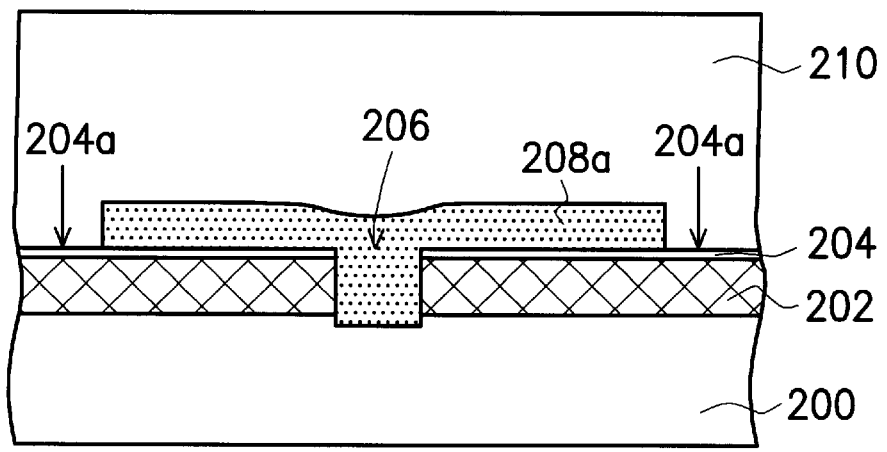

As shown in FIG. 2B, a conductive layer 208 is patterned by first transferring a pattern to a photo-resist coated on the conductive layer 208, followed by a removal of a portion of the conductive layer 208 by mehtods including a reactive ion etch method (RIE). The patterned conductive layer is denoted as 208a. As a result, a part of the etching stop layer 204 is exposed. In this embodiment, the conductive layer 208 is patterned into a T-shape conductive layer 208l as shown in FIG. 2B.

A dielectric layer 210 is further deposited over the conductive layer 208a and an exposed etching stop layer 204a. The dielectric layer 210, for example a silicon oxide layer, is deposited by methods including a chemical vapor deposition method. Other materials can also be used for the dielectric layer 210 as long as they possess the appropriate etching selectivity ratio with respect to the conductive layer 208a and the etching stop layer 204.

Figure 2C:
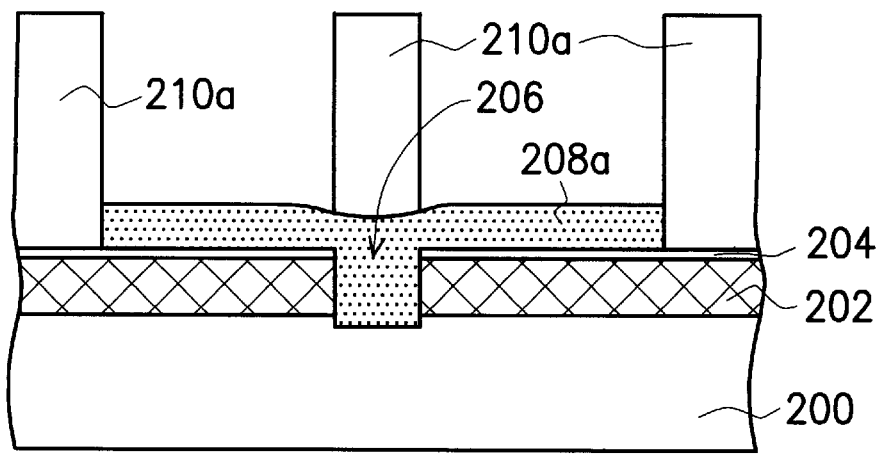

As shown in FIG. 2C, multiple column structures 210a are formed of the dielectric layer 210 by the photolithography and etching technique.

Figure 2D:
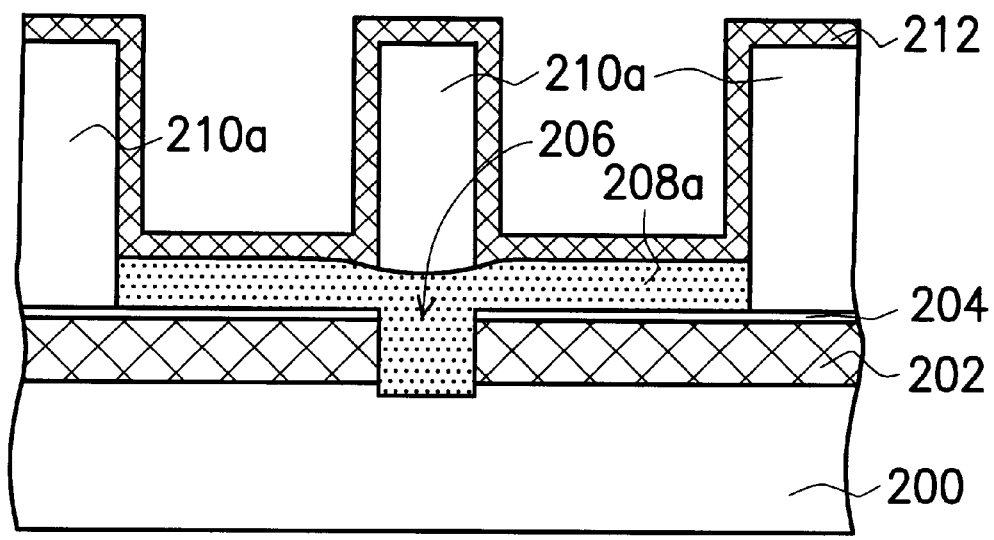

As illustrated in FIG. 2D, another conformal conductive layer 212 is deposited on a surface of the column structures 210a and the conductive layer 208a. This conductive layer 212, for example a doped polysilicon layer or a doped amorphous silicon layer, is deposited by methods including a low pressure chemical vapor deposition method. The thickness for the conductive layer 212 is about 500 to 1000 Å.

Figure 2E:
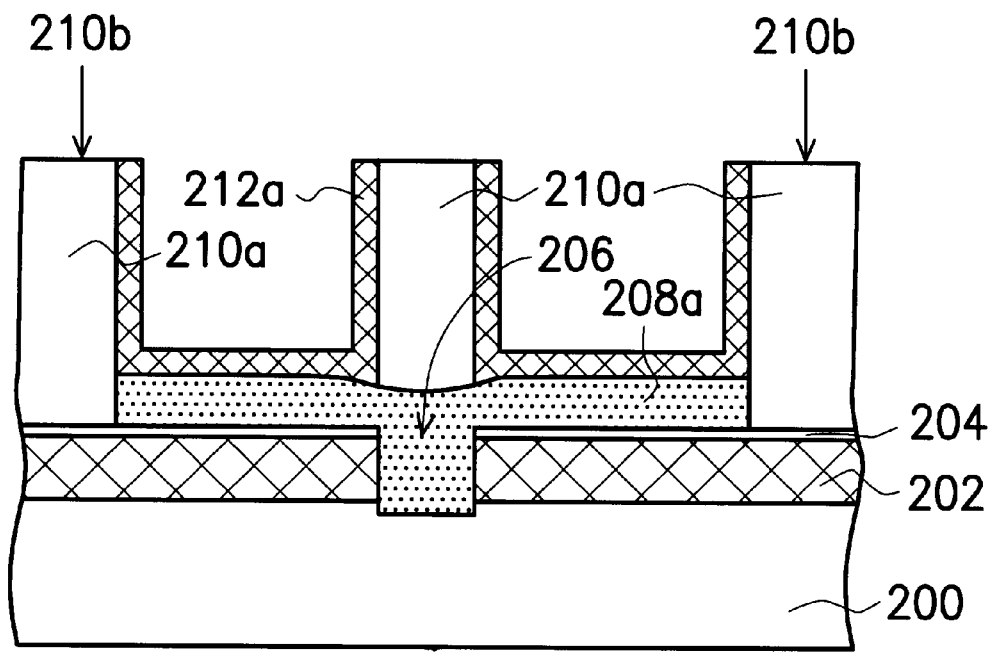

As shown in FIG. 2E, to isolate each capacitor, the conductive layer 212, on the exposed top surface 210b of the column structures 210a is etched away. The conductive layer 212 hence becomes a twin-tub conductive layer 212a. The etching methods used to remove the conductive layer 212 include a chemical mechanical polish technique (CMP) or a reactive ion etching method.

Figure 2F:
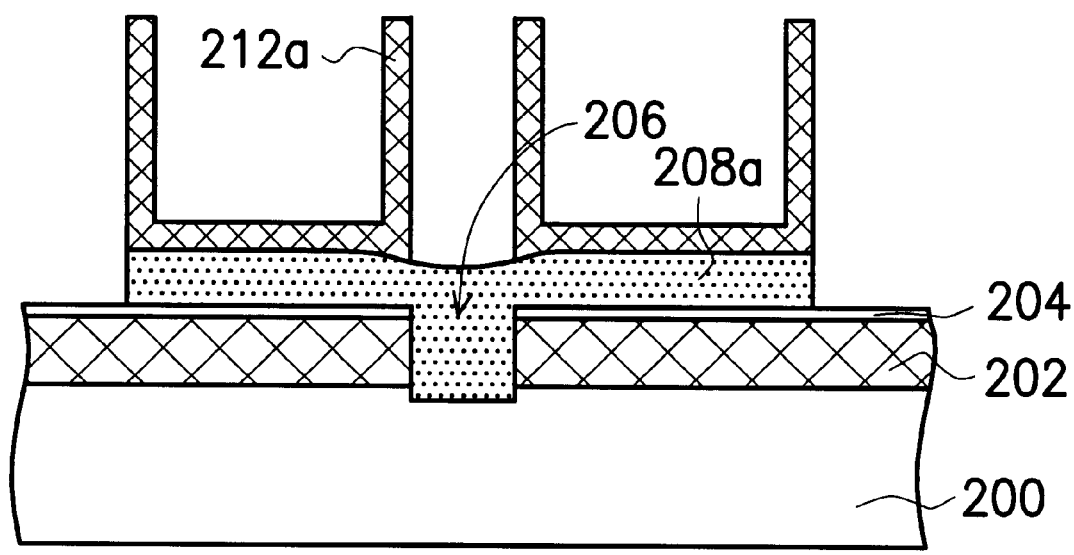

Referring to FIG. 2F, the column structures 210a are removed by methods including a dilute hydrofluoric acid wet etching method or a hydrofluoric acid vapor dry etching method.

The conductive layer 212a of the twin-tub structure is then formed, followed by a sequential deposition of a capacitance layer and a conductive layer, completing the formation of a capacitor device (not shown).

Figure 2G:
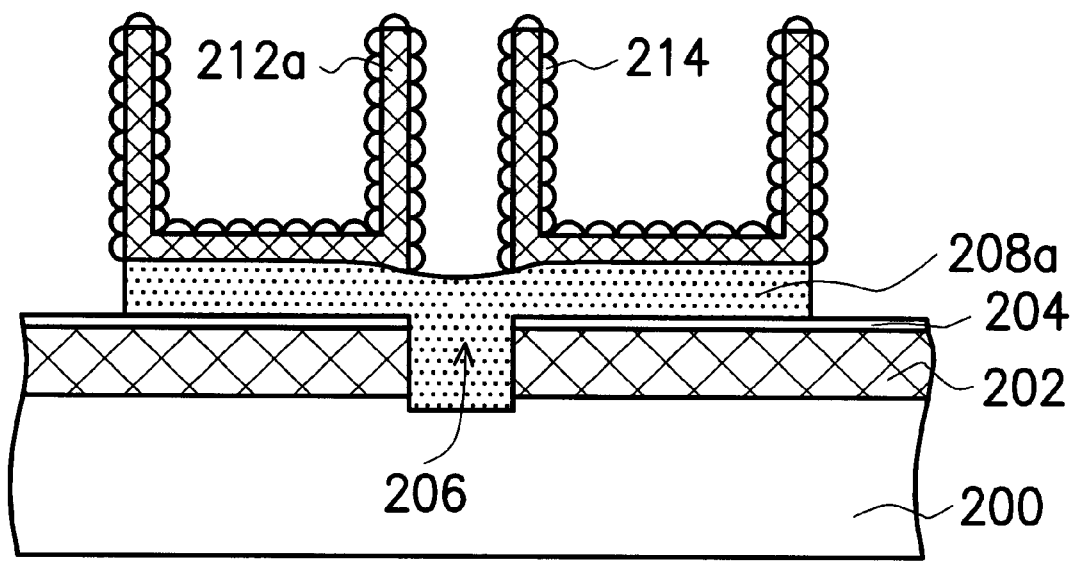

As indicated in FIG. 2G, multiple hemispherical grains 214 can be formed on the conductive layer 212a, if the conductive layer is a doped amorphous silicon layer. These hemispherical grains 214 are formed under an ultra high vacuum using, for example, a silane gas ($SiH_4$) or a di-silane gas ($Si_2H_6$) to selectively seed the hemispherical grain nuclei on an exposed conductive layer 212a of the twin-tub structure.

Still under the high vacuum condition, a thermal treatment is conducted to induce the silicon ion of the conductive layer 212a of the twin-tub device to migrate to the hemispherical grain nuclei, promoting the growth of the hemispherical grain nuclei to the hemispherical grains 214.

The remaining manufacturing procedures for a twin-tub capacitor follow the fabrication technique of a stack capacitor, which can be easily achieved by those who are familiar with the technique, therefore will not be reiterated in the current embodiment.

Accordingly, the current invention provides several column structures formed from a dielectric layer, followed by forming a conductive layer over the column structures. Chemical mechanical polishing is further conducted to removed the conductive layer on the top surface of the column structures to isolate each capacitor. After removing these column structures, a twin-tub capacitor is formed.

The present invention is extremely beneficial for the manufacturing of a capacitor for a DRAM cell because it employs the current semiconductor manufacturing techniques, and the entire process is easy to conduct.

The invention provides a capacitor with a twin-tub structure, wherein the twin-tub structure provides an increased surface area for the capacitor thereby greatly increases the capacitance of the device.

This invention further discloses that a simultaneous application of a hemispherical grain technique and a twin-tub structure enhances the development of high capacitance capacitors, which is consistent with the current developmental trend of semiconductor devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a bottom electrode of a twin-tub capacitor, the method comprising the steps of:

providing a substrate;

forming a first dielectric layer over the substrate;

forming an etching stop layer over the first dielectric layer;

forming a contact window in the etching stop layer and the first dielectric layer;

forming a first conductive layer, covering the etching stop layer and filling the contact window;

defining the first conductive layer to expose a part of the etching stop layer;

forming a plurality of column structures, wherein at least one of the column structures covers the first conductive layer, and another of the column structures completely covers the exposed etching stop layer;

forming a second conductive layer along sidewalls of the column on the first conductive layer without filling spaces between the column structures; and removing the column structures.

2. The fabrication method of a bottom electrode of a twin-tub capacitor according to claim 1, wherein the etching stop layer includes a layer of silicon nitride.

3. The fabrication method of a bottom electrode of a twin-tub capacitor according to claim 1, wherein the first conductive layer includes a doped polysilicon layer.

4. The fabrication method of a bottom electrode of a twin-tub capacitor according to claim 1, wherein the column structures include a layer of silicon oxide.

5. The fabrication method of a bottom electrode of a twin-tub capacitor according to claim 1, wherein the second conductive layer includes a layer of doped polysilicon.

6. The fabrication method of a bottom electrode of a twin-tub capacitor according to claim 1, wherein the second conductive layer includes a layer of doped amorphous silicon.

7. The fabrication method of a bottom electrode of a twin-tub capacitor according to claim 6, wherein a plurality of hemispherical grains are formed on an exposed surface of the doped amorphous silicon layer.

8. The fabrication method of a bottom electrode of a twin-tub capacitor according to claim 1, wherein said second conductive layer is conformally deposited over the column structures, and further comprising removing the second conductive layer located on the top surface of the column structures with a chemical mechanical polish method.

9. A method of fabricating a bottom electrode of a twin-tub capacitor, the method comprising the steps of:

providing a substrate;

forming a first dielectric layer and an etching stop layer over the substrate;

forming a contact window in the etching stop layer and the first dielectric layer;

forming a first conductive layer, covering the etching stop layer and filling in the contact window;

defining the first conductive layer to expose a part of the etching stop layer, forming a second dielectric layer to cover the etching stop layer layer and the remaining first conductive layer;

defining the second dielectric layer to form a plurality of column structures with at least one column structure on the remaining first conductive layer;

forming a conformal doped amorphous silicon layer along a surface profile of the column structures without filling openings between the column structures;

removing a part of the doped amorphous silicon located on the top surface of the column structures;

removing the column structures to form a twin-tub amorphous silicon structures on the remaining first conductive layer; and forming a plurality hemispherical grains on an exposed surface of the doped amorphous silicon layer.

10. The fabrication method of a bottom electrode of a twin-tub capacitor according to claim 9, wherein the etching stop layer includes a silicon nitride layer.

11. The fabrication method of a bottom electrode of a twin-tub capacitor according to claim 9, wherein the first conductive layer includes a layer of doped polysilicon.

12. The fabrication method of a bottom electrode of a twin-tub capacitor according to claim 9, wherein the second dielectric layer includes an silicon oxide layer.

13. The fabrication method of a bottom electrode of a twin-tub capacitor according to claim 9, wherein methods to remove the doped amorphous silicon layer located on the top surface of the column structures include a chemical mechanical polish method.

14. A method of fabricating a bottom electrode of a twin-tub capacitor, the method comprising:

providing a substrate;

forming a first silicon oxide layer over the substrate;

forming a silicon nitride layer over the first silicon oxide layer;

forming a contact window in the first silicon oxide layer and the silicon nitride layer;

forming a doped polysilicon layer covering the silicon nitride layer and filling in the contact window;

defining the doped polysilicon layer to expose a portion of the silicon nitride layer;

forming a second silicon oxide layer over the silicon nitride layer and the defined doped polysilicon layer;

defining the second silicon oxide layer to form a plurality of column structures which cover the exposed silicon nitride layer and a portion of the defined doped polysilicon layer;

forming a conformal conductive layer over a surface of the column structures without filling spaces between the columns;

removing the conductive layer over a surface of the column structures; and removing the column structures.

15. The fabrication method of a bottom electrode of a twin-tub capacitor according to claim 14, wherein the conductive layer includes a doped polysilicon layer.

16. The fabrication method of a bottom electrode of a twin-tub capacitor according to claim 14, wherein the conductive layer includes a doped amorphous silicon layer.

17. The fabrication method of a bottom electrode of a twin-tub capacitor according to claim 16, wherein a plurality of hemispherical grains are formed on an exposed surface of the doped amorphous silicon layer.

18. The fabrication method of a bottom electrode of a twin-tub capacitor according to claim 14, wherein methods to remove the conductive layer that covers the top surface of the column structures include a chemical mechanical polish method.

* * * * *